US006274430B1

(12) United States Patent
Jan et al.

(10) Patent No.: US 6,274,430 B1
(45) Date of Patent: Aug. 14, 2001

(54) FABRICATION METHOD FOR A HIGH VOLTAGE ELECTRICAL ERASABLE PROGRAMMABLE READ ONLY MEMORY DEVICE

(75) Inventors: Yi-Peng Jan; Sung-Mu Hsu, both of Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/625,565

(22) Filed: Jul. 26, 2000

(30) Foreign Application Priority Data

Jul. 7, 2000 (TW) ................................................ 89113550

(51) Int. Cl.⁷ .............................................. H01L 21/8247
(52) U.S. Cl. .......................... 438/258; 438/266; 438/286
(58) Field of Search .................... 437/258, 266, 437/267, 275, 286, 981

(56) References Cited

U.S. PATENT DOCUMENTS

| 5,449,629 | * | 9/1995 | Kajita ..................................... 438/258 |
| 5,674,762 | * | 10/1997 | See et al. ............................... 438/258 |
| 5,879,990 | | 3/1999 | Dormans et al. ..................... 438/257 |
| 5,963,808 | | 10/1999 | Lu et al. ................................ 438/286 |
| 5,976,934 | | 10/1999 | Hayakawa ............................. 438/258 |
| 6,023,085 | * | 2/2000 | Fang ...................................... 438/266 |
| 6,087,211 | * | 7/2000 | Kalnitsky et al. .................... 438/258 |

\* cited by examiner

*Primary Examiner*—Chandra Chaudhari

(57) ABSTRACT

A fabrication method for a high voltage electrically erasable read only memory is described, wherein a substrate comprising a memory device region and a peripheral high voltage circuit region is provided. A floating gate is formed on the substrate in the device region, while a gate electrode is formed on the substrate in the peripheral circuit region. Thereafter, an oxide/nitride/oxide layer is formed on the substrate, wherein the oxide/nitride/oxide layer is formed by stacking from bottom to top a first oxide layer, a nitride layer and a second oxide layer. The second oxide layer in the peripheral high voltage circuit region is then removed, followed by removing the nitride layer in the peripheral high voltage circuit region. An oxidation on the second oxide layer and a double diffused drain implantation are conducted to form a bird's beak structure at the bottom corner of the gate electrode and to form a double diffused drain structure in the substrate on both sides of the gate electrode. A control gate is then formed on the oxide/nitride/oxide layer of the device region and a gate electrode is formed in the peripheral low voltage circuit region. Subsequently, a source/drain region is formed in the substrate on both sides of the gate electrode in the peripheral low voltage circuit region.

15 Claims, 3 Drawing Sheets

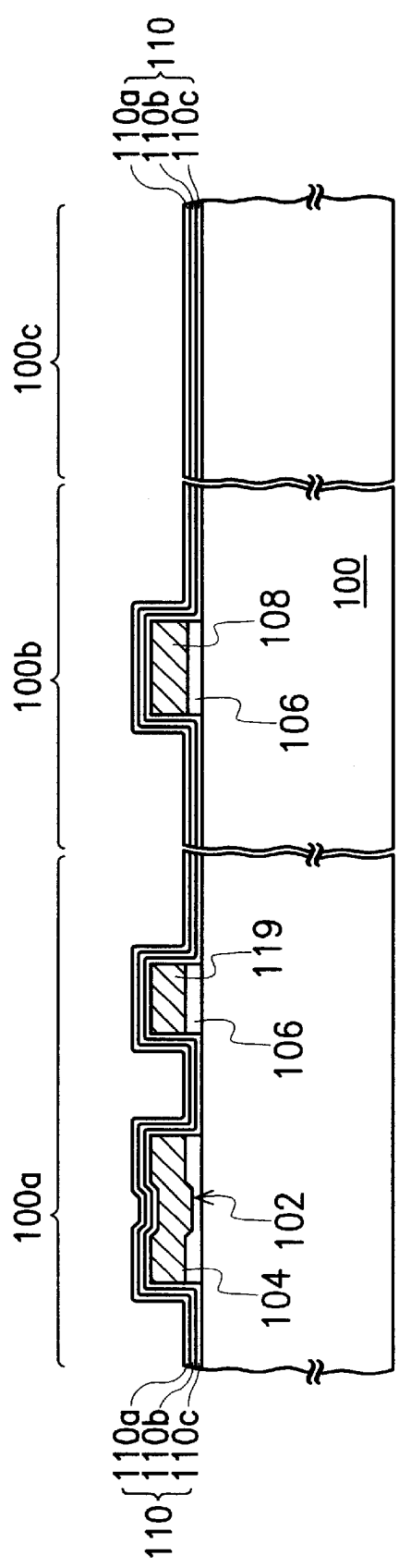
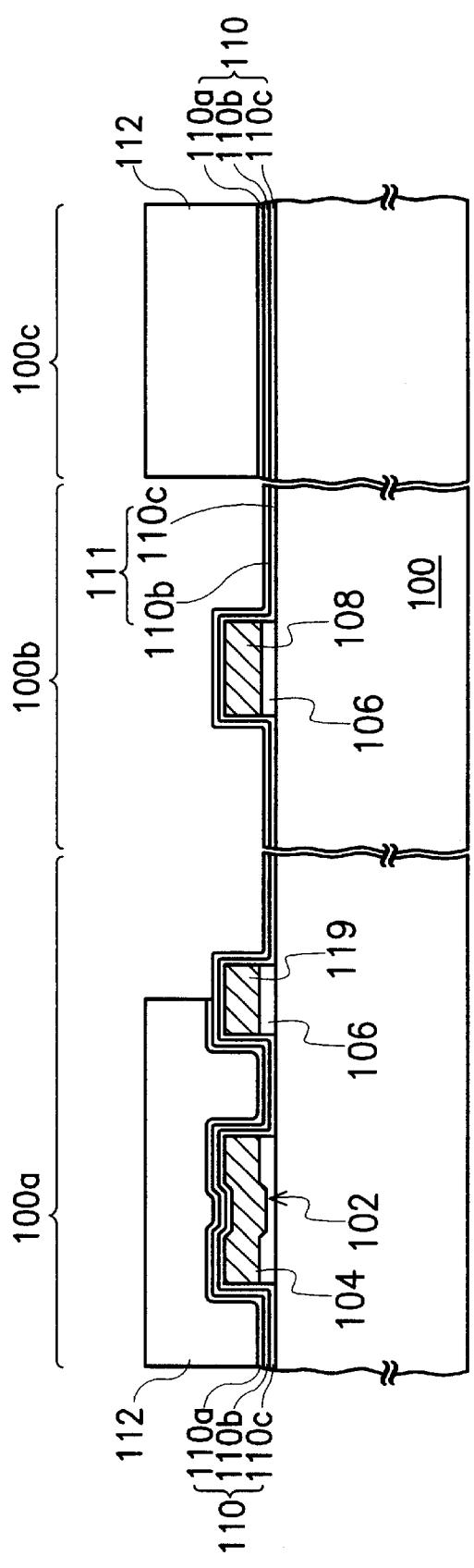

FABRICATION METHOD FOR A HIGH VOLTAGE ELECTRICAL ERASABLE PROGRAMMABLE READ ONLY MEMORY DEVICE

CROSS-REFERENCE TO RELATED APPLICATION

This application claims the priority benefit of Taiwan application serial no. 89113550, filed Jul. 7, 2000.

BACKGROUND OF THE INVENTION

1. Field of the Invention

The present invention relates to a fabrication method for a non-volatile memory device. More particularly, the present invention relates to a fabrication method for an electrically erasable programmable read only memory device that has a high breakdown voltage.

2. Description of the Related Art

In the conventional non-volatile memory device, which includes the erasable programmable read only memory (EPROM) device, the electrically erasable programmable read only memory (EEPROM) device and the flash memory device, the stored memory or data is retained and is not being erased during the shortage of the power supply. These types of memory devices thus possess a superior information storage characteristic, and the research for the development in this area continues.

An electrically erasable programmable read only memory is one type of the non-volatile memory devices. In general, an EEPROM cell comprises two gates, which includes a floating gate formed with polysilicon for charge storage and a control gate to control the retrieval of information. The floating gate is normally maintained in a "floating" condition and is not connected to any circuitry, whereas the control gate is normally connected to the word line. The EEPROM cell further includes a tunnel oxide layer and a dielectric layer formed between the substrate and the floating gate, and between the floating gate and the control gate, respectively. In addition, source/drain regions are formed in the substrate on both sides of the control gate.

The peripheral high voltage circuit region device, used to connect the EEPROM and the peripheral circuit, requires withstanding a higher voltage when the electrical erasure or the programming process is performed. However, under the current trend of a higher integration, the device dimension is reduced according to the design rule. The device dimension for the peripheral high voltage circuit region decreases correspondingly. Since under a normal high voltage operation, the thickness of the device gate oxide layer for the peripheral high voltage circuit region can not be easily reduced. Similarly, the channel length of the peripheral high voltage circuit region can not be reduced. The difficulty for fabricating an electrically erasable programmable read only memory device is thereby greatly increased.

Furthermore, during the operation of a memory transistor, the higher the gate-coupling ratio between the floating gate and the control gate, the working voltage for an operation is lower. The gate-coupling ratio between the floating gate and the control thus needs to be increased.

Approaches to increase the gate-coupling ratio include increasing the overlap area between the floating gate and the control gate, reducing the thickness of the dielectric layer between the floating gate and the control gate, and increasing the dielectric constant (k) of the dielectric layer between the floating gate and the control gate. The thickness of the dielectric layer between the floating gate and the control gate, however, must maintain a certain thickness to prevent an entry of the electrons trapped in the floating gate into the control gate, leading to an ineffective device. Since increasing the dielectric constant of the dielectric layer between the floating gate and the control gate involves issues such as replacing the processing equipment and the maturity or immaturity of the current technology, the approach of increasing the dielectric constant of the dielectric layer can not be easily achieved.

SUMMARY OF THE INVENTION

Based on the foregoing, a fabrication method for a high voltage electrically erasable programmable read only memory device is provided. According to one preferred embodiment of the present invention, a substrate comprising a memory device region, a peripheral low voltage circuit region and a peripheral high voltage circuit region is provided. A floating gate is formed on the substrate in the memory device region, while a gate electrode is formed on the substrate in the peripheral high voltage circuit region. A layer of oxide/nitride/oxide is then formed on the substrate, wherein the oxide/nitride/oxide layer is formed by stacking from bottom to top a first oxide layer, a nitride layer and a second oxide layer. The second oxide layer located in the peripheral high voltage circuit region is then removed, followed by removing the nitride layer in the peripheral high voltage circuit region. Thereafter, an oxidation process on the second oxide layer of the peripheral high voltage circuit region and a double diffused drain implantation process are conducted to form a bird's beak structure at the bottom corners of the gate electrode, and a double diffused drain structure in the substrate on both sides of the gate electrode, respectively. A control gate is then formed on the oxide/nitride/oxide layer on the memory device region. Subsequently, a source/drain region is formed in the substrate on both sides of the gate electrode in the peripheral low voltage circuit region.

The present invention provides a fabrication method for a high breakdown voltage electrically erasable programmable read only memory device. Since a bird's beak structure is formed at the bottom corners of the gate electrode in the peripheral high voltage circuit region, the bottom corners of the gate electrode thus become rounded to increase the thickness of the gate oxide layer at the bottom corners of the gate electrode. The concentration of the electric field at the bottom corners of the gate electrode is thereby reduced. Furthermore, the breakdown voltage of the gate structure in the peripheral high voltage circuit region is increased without reducing the thickness of the gate oxide layer.

In addition, the floating gate of the present invention is completely enclosed by the oxide/nitride/oxide layer to increase the gate-coupling ratio (GCR) between the control gate and the floating gate.

Furthermore, the rounding of the bottom corners of the gate electrode in the peripheral high voltage circuit region is formed along with the formation the gate oxide layer in the low voltage circuit region. The driving-in process for the double diffused drain structure can also be accomplished by the same process used for the rounding of bottom corners of the gate electrode. Thus, no additional thermal budget is required.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the present invention, and are incorporated in and constitute a part of this specification. The drawings illustrate embodiments of the invention and, together with the description, serve to explain the principles of the invention. In the drawings, FIGS. 1A to 1F are schematic, cross-sectional views showing the manufacturing of an electrically erasable read only memory according to a preferred embodiment of the present invention.

DESCRIPTION OF THE PREFERRED EMBODIMENT

Figure 1C:
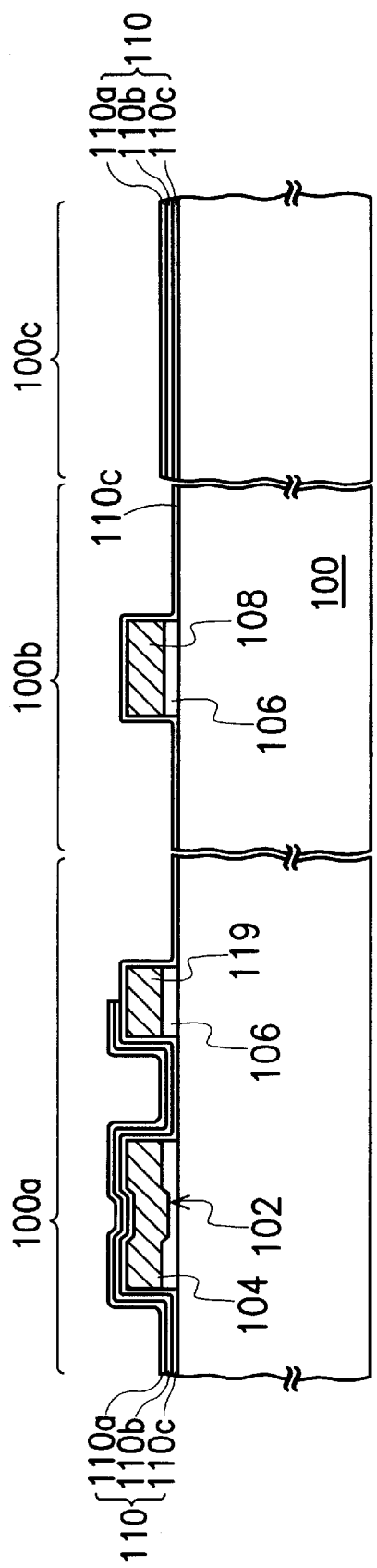

FIGS. 1A to 1F are schematic, cross-sectional views showing the manufacturing of an electrically erasable read only memory according to one preferred embodiment of the present invention.

Referring to FIG. 1A, a substrate 100 which is separated into a memory device region 100a, a peripheral circuit high voltage region 100b and a peripheral circuit low voltage region 100c, is provided. A floating gate 104 comprising a tunnel oxide layer 102 and a select gate are formed on the substrate 100 in the memory device region 100a. A gate electrode 108 comprising a gate oxide layer 106 is formed on the substrate 100 in the peripheral high voltage circuit region 100b, while a gate electrode has not yet been formed in the peripheral low voltage circuit region 100c.

Thereafter, a structural layer 110 of an oxide/nitride/oxide (ONO) layer, which includes the oxide layer 110a, the nitride layer 110b and the oxide layer 110c is formed on the substrate 100. The ONO structural layer is formed by, for example, chemical vapor deposition.

Referring to FIG. 1B, a patterned photoresist layer 112 is formed on the substrate 100, and the patterned photoresist layer 112 exposes the peripheral high voltage region 100b and the selective gate 119 of the memory device region 100a and the ONO structural layer 110 that covers the subsequently formed drain terminal. When the subsequently formed conductive type for the high voltage device is a single conductive type, the photomask used in forming the double diffused drain (DDD) of the high voltage device in the peripheral high voltage circuit region 100b can be used as the mask (not shown in Figure) to form the patterned photoresist layer 112 in this processing step.

Still referring to FIG. 1B, using the patterned photoresist layer 112 as a mask, the upper oxide layer 110a and the silicon nitride layer 110b of the ONO structural layer 110 on the subsequently formed drain terminal of the select-gate 119 in the memory device region 100a and in the peripheral high voltage circuit region 100b is removed, exposing the nitride layer 110b of the ONO structural layer 110 to form the nitride/oxide (NO) structural layer 111. Removing the oxide layer 110a includes using a fluorinated helium solution to remove the upper oxide layer 110a of the ONO structural layer, leaving the ONO structural layer 111 in the memory device region 100a and the ONO structural layer 110 in the peripheral high voltage circuit region 100b.

Continuing to FIG. 1C, the patterned photoresist layer 112 is removed exposing the ONO structural layer 110 in the memory device region 100a. Further using the upper oxide layer 110a of the ONO structural layer 110 in the memory device region 100a as a mask, the nitride layer 110b (referring to FIG. 1B) of the NO structural layer 111 in the peripheral high voltage circuit region 100b is removed, exposing the oxide layer 110c that is under the nitride layer 110b. The nitride layer 110b is removed by, for example, etching the nitride layer 110b with a hot phosphoric acid solution until the surface of the oxide layer 110c is exposed. The nitride layer 110b in the device region 100a, on the other hand, is protected from being etched by the oxide layer 110a in the device region 100a.

Figure 1D:
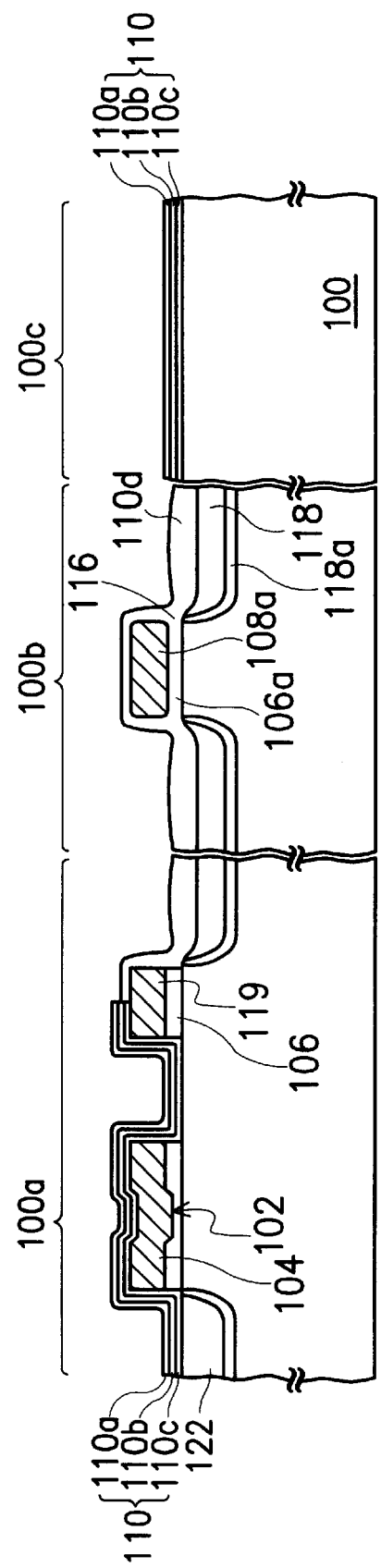

As shown in FIG. 1D, the gate electrode 108 and oxide layer 110c in the peripheral high voltage circuit region 100b, and the gate oxide layer 106 are transformed are transformed to the gate electrode 108a, oxide layer 110d and the gate oxide layer 106a having bird's beak structures 116 at the bottom corners. Furthermore, a source/drain region 118, which comprises the double diffused drain structure, is formed in the substrate 100 of the peripheral high voltage circuit region 110b.

The formation of the control gate 114, and the gate electrode 108a, the oxide layer 110d and the gate oxide layer 106a having the bird's beak structures 116 at the bottom corners, and the source/drain regions 118 and 122 (as in FIG. 1F) includes performing a gate edge oxidation process. The gate edge oxidation process, for example, includes an thermal oxidation process to form a bird's beak structure 118 at the bottom corners of the gate electrode, and to transform the gate electrode 108, the oxide layer 110c and the gate oxide layer 106 to the gate electrode 108a, the oxide layer 110d and the gate oxide layer 106a. Subsequently, the double diffused drain ion implantation is conducted to form the double diffused drain structure 118a in the substrate 100 on both sides of the gate electrode 108a in the peripheral high voltage circuit region 100b. A source/drain region 118 comprising the double diffused drain region structure 118a is further formed in the substrate 100 on both sides of the gate electrode 108a in the peripheral high voltage circuit region 100b, and a source/drain region is formed in the substrate 100 on one side of the floating gate 104 in the memory device region 100a.

In addition, the double diffusion implantation process can be conducted before forming the bird's beak structure 116 at the bottom corners the gate electrode having. Thereafter, the thermal oxidation process that is performed to form the bird's beak structure at the bottom corners of the gate electrode 108 can also be used to drive-in the double diffused drain structure 118a.

Figure 1E:
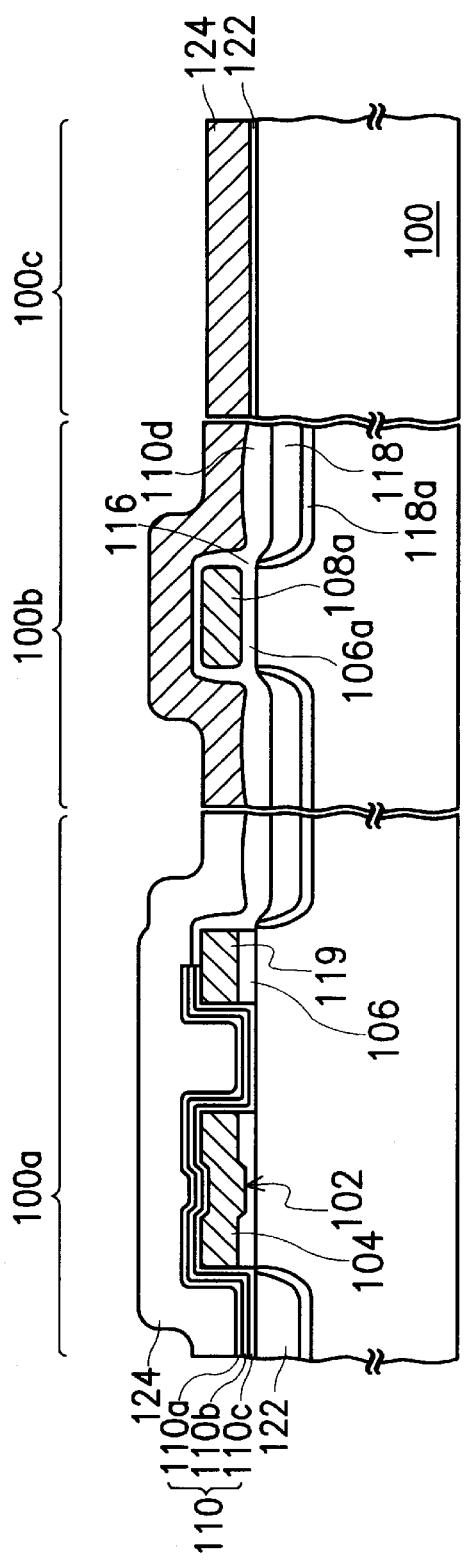

Continuing to FIG. 1E, a photoresist layer (not shown in Figure) is formed on the substrate 100 to cover the memory device region 100a and the peripheral high voltage circuit region 100b. The ONO structure 110 of the peripheral low voltage circuit region 100c is then etched, followed by removing the photoresist layer. After this, a gate oxide layer 122 is formed on the peripheral low voltage circuit region 100c, for example, by thermal oxidation. If thermal oxidation is used to form the gate oxide layer 122, the temperature of the thermal oxidation process is sufficient to form a bird's beak structure 118 at the bottom corners of the gate oxide layer in the peripheral high voltage circuit region 100b. The processing step as discussed in the above and illustrated in FIG. 1D can be omitted. The bird's beak structure 118 and the gate oxide layer in the peripheral low voltage circuit region 100c are thus formed in the same processing step. A conductive layer 124 is then formed on the substrate to cover the memory device region 100a, the peripheral high voltage region 100b and the peripheral low voltage region 100c. The conductive layer 124, for example, polysilicon, is formed by chemical vapor deposition.

Figure 1F:
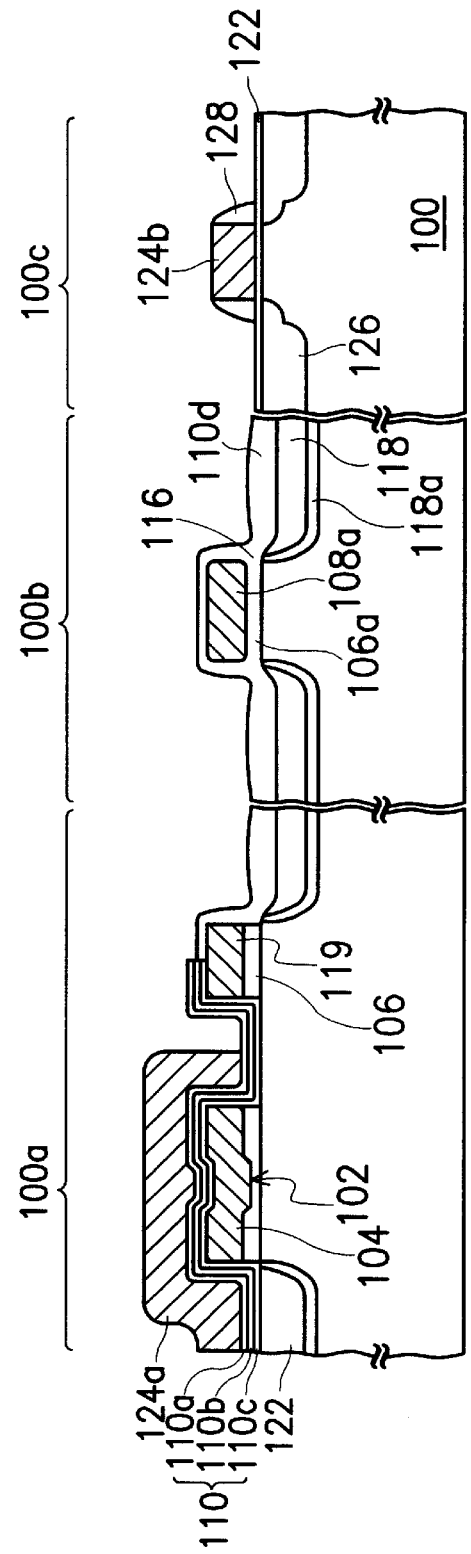

As shown in FIG. 1F, photolithography and etching techniques are employed to define the above pattern for the conductive layer 124 to form the control gate 124a with the conductive layer 124 that is on the ONO structural layer 110 in the memory device region 100a. A gate electrode 124b is also formed with the conductive layer 124 that is on the gate oxide layer 122 left in the peripheral low voltage circuit region 100c. The control gate 114, the ONO structural layer 110, the floating gate 104 and the tunnel oxide layer 102 together form an electrical erasable programmable read only memory device comprising a split gate 119. Thereafter, source/drain regions 126 are formed in the peripheral low voltage circuit region 100c and spacers are formed on the sidewalls of the gate electrode 124b.

According to the present invention, the bird's beak structure 118a is formed at the bottom corners of the gate electrode 108a in the peripheral high voltage circuit region 100b. In another words, the bottom corners of the gate electrode 108 are rounded, the concentration of the electric field at the bottom corners at the gate electrode 108a is thereby reduced without having to reduce the thickness of the gate oxide layer 106a. Thus, the breakdown voltage of the gate structure in the peripheral high voltage circuit region is increased and the channel length is effectively reduced.

The present invention further provides a floating gate 104, which is completely enclosed by the ONO structural layer 110. The gate-coupling ratio between the control gate 114 and the floating gate 104 can thereby greatly increased.

Furthermore, when the conductive type of the subsequently formed high voltage device is the single conductive type, the photomask used in forming the patterned photoresist layer 112 can be the same mask used in forming the double diffused drain structure of the high voltage device. The number of photomasks is thus reduced. In addition, the rounding of the bottom corners of the gate electrode 108a in the peripheral high voltage circuit region 100b can be accomplished during the formation of the gate oxide layer of the low voltage device. The drive-in for the double diffused drain structure 118a can also be accomplished during the rounding process for the bottom corners of the gate electrode 108a in the peripheral high voltage region 100b. Thus, no additional thermal budget is required.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a high voltage electrically erasable read only memory device comprising the steps of:

providing a substrate, wherein the substrate comprises a memory device region and a peripheral high voltage circuit region and a peripheral low voltage circuit region, wherein a floating gate and a select-gate are formed on the substrate in the memory device region, and a high voltage gate electrode is formed on the substrate in the peripheral high voltage circuit region;

forming an oxide/nitride/oxide layer on the substrate, wherein the oxide/nitride/oxide layer is formed by stacking from bottom to top a first oxide layer, a nitride layer and a second oxide layer;

forming a patterned photoresist layer on the substrate, wherein the patterned photoresist layer exposes the oxide/nitride/oxide layer in the peripheral high voltage circuit region and a portion of the memory device region;

removing the second oxide layer in the peripheral high voltage circuit region and a portion of the second oxide layer in the memory device region;

removing the patterned photoresist layer;

removing the nitride layer in the peripheral high voltage circuit region and a portion of the nitride layer in the memory device region;

performing an oxidation process on a bottom corner of the gate electrode, wherein the first oxide layer is oxidized and a bird's beak structure is formed at the bottom corner of the gate electrode;

removing the oxide-nitride-oxide layer in the peripheral low voltage circuit region;

conducting a double diffused drain ion implantation process to form a double diffused drain structure in the substrate on both sides of the high voltage gate electrode in the peripheral high voltage circuit region;

forming a first source/drain region that comprises the double diffused drain structure on both sides of the gate electrode in the substrate, and a second source/drain region on one side of the floating gate in the substrate;

forming a gate oxide layer on the peripheral low voltage circuit region;

forming a control gate on the oxide/nitride/oxide layer of the memory device region and low voltage gate electrode on the gate oxide layer of the peripheral low voltage circuit region; and forming a third source/drain region on the substrate on both sides of the low voltage gate electrode.

2. The fabrication method according to claim 1, wherein a photomask used to form the patterned photoresist layer is a same mask used in the double diffused drain implantation process.

3. The fabrication method according to claim 1, wherein the oxidation process performed on the bottom corner of the gate electrode includes a thermal oxidation process.

4. The fabrication method according to claim 1, wherein removing the second oxide layer includes using a solution containing fluorinated helium to remove the second oxide layer.

5. The fabrication method according to claim 1, wherein removing the nitride layer includes using a hot phosphoric acid solution to etch the nitride layer.

6. The fabrication method according to claim 1, wherein the oxidation process on the gate electrode bottom corner and a formation of the gate oxide layer on the peripheral low voltage circuit region are accomplished in a same thermal oxidation process.

7. A fabrication method for a high voltage electrically erasable read only memory device, which is applicable on a substrate and the substrate comprises a memory device region and a peripheral high voltage circuit region, wherein a floating gate and a select-gate are formed on the substrate in the memory device region and a gate electrode is formed on the substrate in the peripheral high voltage circuit region, the method comprising:

forming an oxide/nitride/oxide layer on the substrate;

forming a patterned photoresist layer on the substrate, wherein the patterned photoresist layer exposes the oxide/nitride/oxide layer in the peripheral high voltage circuit region and a portion of the oxide/nitride/oxide layer in the memory device region;

removing a portion of an upper oxide layer of the oxide/nitride/oxide layer using the photoresist layer as a mask;

removing the patterned photoresist layer;

removing a portion of the nitride layer of the oxide/nitride/oxide layer;

performing a double diffused ion implantation to form a double diffused drain structure in the substrate on both sides of the gate electrode;

oxidizing an lower oxide layer of the oxide/nitride/oxide layer to form a bird's beak structure at a bottom corner of the gate electrode;

forming a control gate on the oxide/nitride/oxide layer in the device region, wherein the control gate, the oxide/nitride/oxide layer, and the floating gate form an electrically erasable read only memory having a split gate; and forming a first source/drain region that comprises the double diffused drain structure in the substrate on both sides of the gate electrode, and a second source/drain region in the substrate on one side of the floating gate.

8. The fabrication method according to claim 7, wherein a photomask used to form the patterned photoresist layer is same mask used for the double diffused drain ion implantation process.

9. The fabrication method according to claim 7, wherein forming the bird's beak structure includes performing a thermal oxidation process.

10. The fabrication method according to claim 7, wherein removing the upper oxide layer includes using a solution containing fluorinated helium to remove the upper oxide layer.

11. The fabrication method according to claim 7, wherein the nitride layer is removed by etching with a hot phosphoric acid solution.

12. A fabrication method for a high voltage electrically erasable read only memory, which is applicable on a substrate and the substrate comprises a memory device region and a peripheral high voltage circuit region, wherein a floating gate is formed on the substrate in the memory device region and a gate electrode is formed on the substrate in the peripheral high voltage circuit region, comprising forming an oxide/nitride/oxide layer on the substrate, wherein the oxide/nitride/oxide layer is formed by stacking from bottom to top a first oxide layer, a nitride layer and a second oxide layer;

removing the second oxide layer in the peripheral high voltage circuit region;

removing the nitride layer in the peripheral high voltage circuit region;

oxidizing the first oxide layer and performing a double diffused drain implantation to form a bird's beak structure at a bottom corner of the gate electrode and to form a double diffused drain structure in the substrate on both sides of the gate electrode;

forming a control gate on the oxide/nitride/oxide layer in the memory device region; and forming a first source/drain region that comprises the double diffused drain structure in the substrate on both sides of the gate electrode, and a second source/drain region in the substrate on one side of the floating gate.

13. The fabrication method according to claim 12, wherein forming the bird's beak structure includes performing a thermal oxidation process.

14. The fabrication method according to claim 12, wherein removing the second oxide layer includes using a solution containing fluorinated helium to remove the second oxide layer.

15. The fabrication method according to claim 12, wherein removing the nitride layer includes using a hot phosphoric acid solution to etch the nitride layer.

* * * * *